(12) United States Patent
Enomoto et al.

(10) Patent No.: US 6,344,117 B2
(45) Date of Patent: *Feb. 5, 2002

(54) BACKING PLATE FOR SPUTTERING

(75) Inventors: Masatoshi Enomoto; Seiji Tasaki; Naoyuki Kawata; Takenori Hashimoto, all of Tochigi (JP)

(73) Assignee: Showa Denko K.K., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/383,506

(22) Filed: Aug. 26, 1999

(30) Foreign Application Priority Data

Aug. 28, 1998 (JP) ............................................ 10-242821

(51) Int. Cl.⁷ ............................ C23C 14/35; B23K 20/12
(52) U.S. Cl. ........................... 204/298.09; 204/298.12; 204/298.15; 118/724; 228/2.1; 228/110.1; 228/112.1; 228/117; 228/158
(58) Field of Search ...................... 204/298.09, 298.12, 204/298.15; 118/724; 228/110.1, 112.1, 117, 158, 2.1

(56) References Cited

U.S. PATENT DOCUMENTS

| | | | | | |
|---|---|---|---|---|---|
| 4,219,397 A | * | 8/1980 | Clarke | ................... | 204/192.12 |
| 4,221,652 A | * | 9/1980 | Kuriyama | .............. | 204/192.12 |
| 4,569,745 A | * | 2/1986 | Nagashima | ............ | 204/298.09 |
| 5,286,361 A | * | 2/1994 | Makowiecki et al. | .. | 204/298.12 |
| 5,433,835 A | * | 7/1995 | Demaray et al. | ...... | 204/298.09 |
| 5,482,897 A | * | 1/1996 | Lynch | ........................ | 437/209 |
| 5,830,336 A | * | 11/1998 | Schulz | .................. | 204/298.12 |
| 5,892,272 A | * | 4/1999 | Lynch | ........................ | 257/668 |

* cited by examiner

*Primary Examiner*—Mark F. Huff
*Assistant Examiner*—Daborah Chacko-Davis (57) ABSTRACT

A backing plate 1 for sputtering is constituted by a base portion 2 comprising a plate member made of aluminum or its alloy, a surface of which is attached with a target T of an ITO sintered body or the like and a cooling portion 3 in a flat plate shape having a cooling medium flow path 6 at an inner portion thereof. Further, the cooling portion 3 is integrally attached to a rear face of the base 2 by friction agitation bonding. The cooling portion 3 comprises a roll bond panel 4 made of aluminum or its alloy and inner hollow portions of bulged pipe portions 5 constitute the cooling medium flow path 6. Thereby, a backing plate which is light-weighted and has high cooling efficiency can be provided.

8 Claims, 8 Drawing Sheets

BACKING PLATE FOR SPUTTERING

BACKGROUND OF THE INVENTION

1. Field of the Invention

The present invention relates to a backing plate for sputtering preferably used in a sputtering apparatus of a magnetron sputtering system or the like used in fabricating, for example, a liquid crystal panel.

2. Description of the Related Art

Figure 7A:
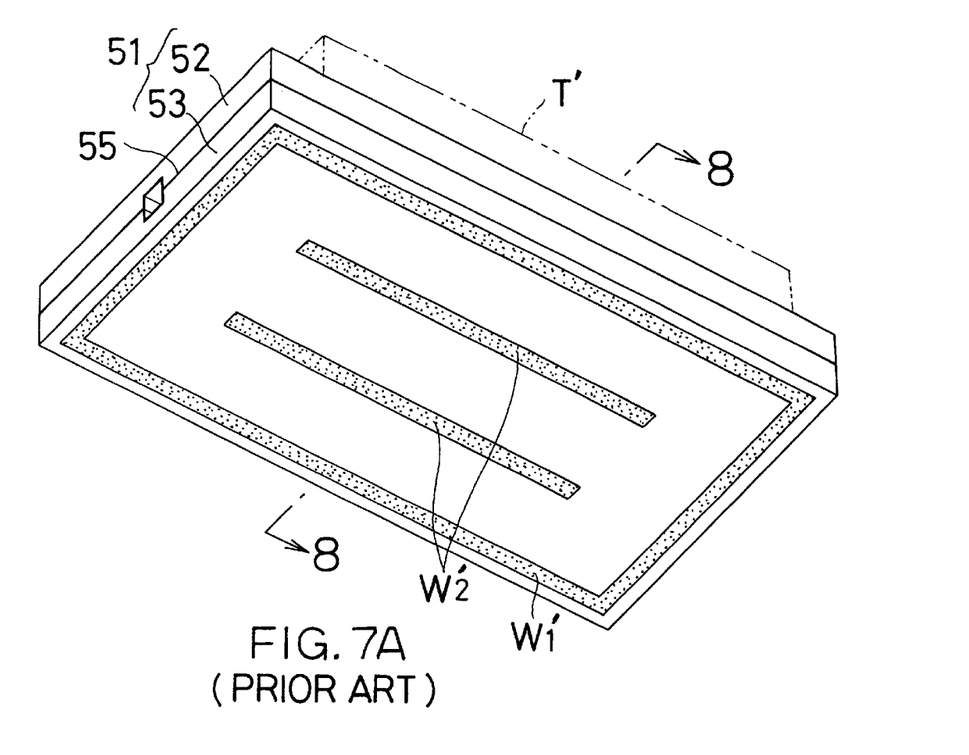
FIG. 7A is a perspective view of a conventional backing plate for sputtering.
Figure 7B:
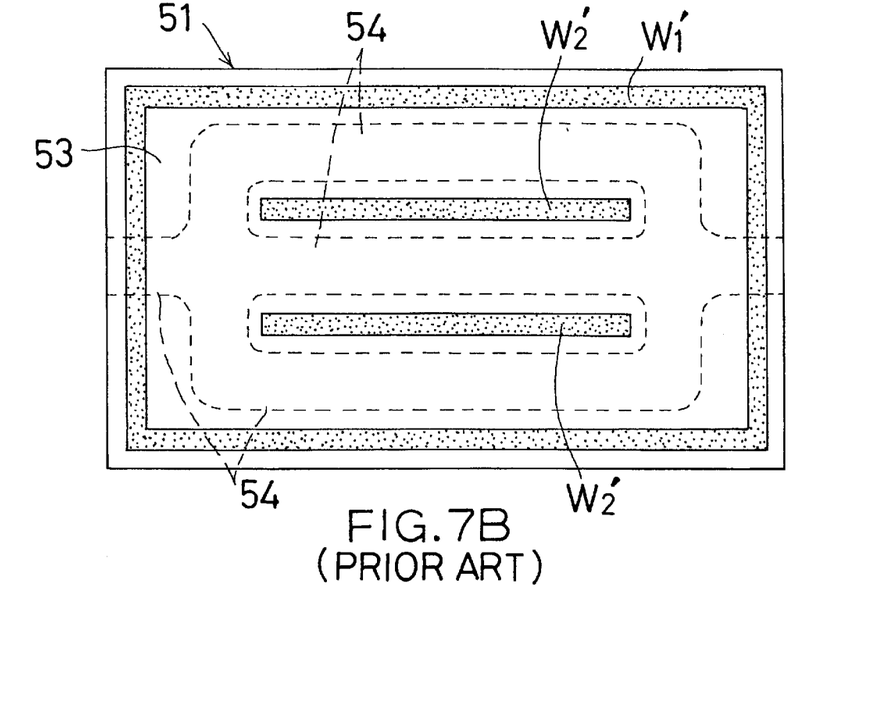
FIG. 7B is a bottom view of the backing plate.
Figure 8:
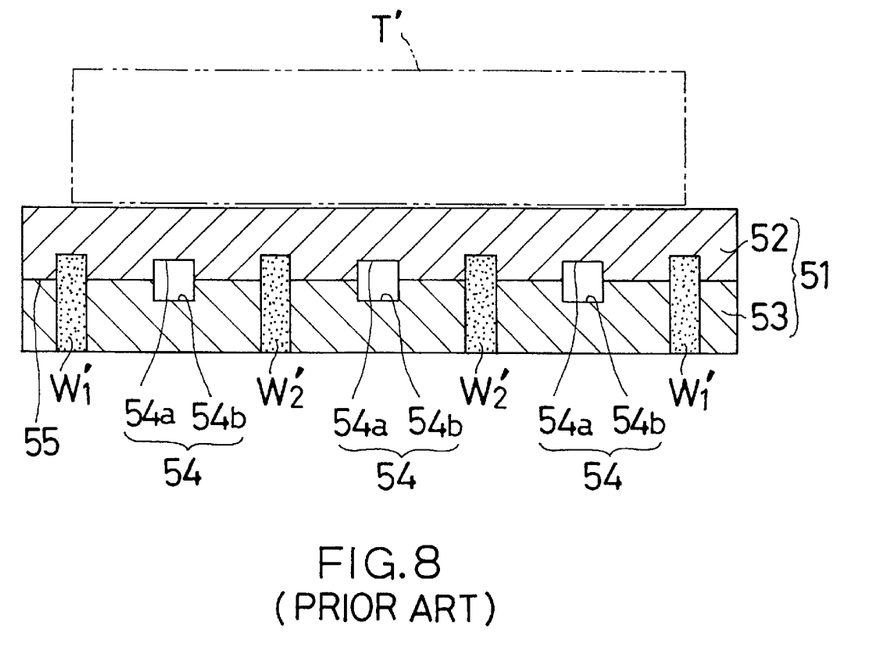
FIG. 8 is a sectional view taken along a line 8—8 of FIG. 7A.

For example, as shown in FIG. 7A and FIG. 7B, there is used a backing plate 51 a surface of which is attached with a target T' of an ITO (Indium Tin Oxide) sintered body or the like in a magnetron sputtering system. As shown in FIG. 8, the backing plate 51 is provided with a cooling medium flow path 54 at an inner portion thereof for cooling the target T' attached to the surface. Further, a rear face side of the backing plate 51 is arranged with a magnet, not illustrated, for applying a magnetic field on sputtering particles.

The conventional backing plate 51 comprises a clad plate integrally attached with two sheets of metal plates 52 and 53. As shown in FIG. 8, grooves 54a and 54b for forming the cooling medium flow path are respectively formed at an overlap face 55 for overlapping the two metal plates 52 and 53 and the two metal plates 52 and 53 are made to overlap and integrally bonded by welding (weld portions W1', W2') by which the cooling medium low path 54 in a circuit shape is formed at the inner portion. Further, a cooling medium (not illustrated) injected before welding the two metal plates 52 and 53 is sealed in the cooling medium flow path 54 of the backing plate 51.

Meanwhile, as mentioned above, the cooling medium flow path 54 of the conventional backing plate 51 is constituted by the grooves 54a and 54b for forming the cooling medium flow path and these grooves 54a and 54b have conventionally been formed by pressing the overlap faces 55 of the respective metal plates 52 and 53 by forming dies having forming projections in correspondence with the grooves.

However, according to the above-described conventional backing plate 51, in order to form the grooves 54a and 54b for forming the cooling medium flow path, expensive forming dies must be used and therefore, there is a drawback in which the fabrication cost is increased. Particularly, although the grooves 54a and 54b for forming the cooling medium flow path are preferably formed in a complicated circuit shape to promote the cooling efficiency, in this case, there are used forming dies having complicated forming projections in correspondence with the circuit shape of the grooves 54a and 54b and accordingly, the fabrication cost is further increased.

Further, according to the above-described conventional backing plate 51, in order to prevent the cooling medium sealed in the cooling medium flow path 54 from oozing to the overlap face 55 and leaking to outside, substantially total peripheries of peripheral edges of the two metal plates 52 and 53 must be welded without fail (weld portion W1') and therefore, the welding operation becomes troublesome. The welding operation must firmly be carried out such that the weld portion W1' becomes liquidtight when the cooling medium comprises a liquid and the weld portion W1' becomes airtight when the cooling medium comprises a gas and therefore, the welding operation becomes further troublesome. There also poses a problem in which when a weld defect such as a nonwelded portion is present in the weld portion W1', the cooling medium leaks out from the weld defect portion and accordingly, the atmosphere in the apparatus is contaminated and excellent film forming condition cannot be established. Further, although it is conceivable to attach together the two metal plates 52 and 53 by using fastening members of rivets or the like, in this case, there is a concern of leaking the cooling medium from portions of the overlap face among contiguous fastening portions, which is insufficient in achieving prevention of leakage of the cooling medium.

Further, according to the conventional backing plate 51, two sheets of the metal plates 52 and 53 need to strictly position such that corresponding ones of the grooves 54a and 54b are aligned. Accordingly, in welding them, there is separately needed a fixing device for preventing a positional shift between the two metal plates 52 and 53 and therefore, the fabrication cost is increased also in this respect and the welding operation becomes troublesome.

SUMMARY OF THE INVENTION

The invention has been carried out in order to resolve such difficulties and it is an object of the invention to provide a backing plate for sputtering which can be fabricated simply.

It is another object of the invention to provide a backing plate for sputtering having high thermal conductivity.

It is another object of the invention to provide a backing plate for sputtering which is light-weighted.

Other object of the invention will become apparent by embodiments shown below.

In order to achieve the above-described object, according to an aspect of the invention, there is provided a backing plate for sputtering, wherein a cooling portion made of a metal in a plate-like shape having a cooling medium flow path at an inner portion thereof is attached together to a base portion made of a metal in a plate-like shape.

According to the invention, as means for attaching the cooling portion to the base portion, for example, welding or a fastening member is used. As welding, for example, welding utilizing a high energy density heat source such as laser welding, electron beam welding or the like or friction agitation bonding is used. Meanwhile, as a fastening member, for example, rivet, screw, bolt, nut or clamp is used.

Further, according to the backing plate for sputtering of the invention, the cooling medium flow path is formed at the inner portion of the cooling portion and accordingly, when the cooling portion is attached to the base portion by welding with the purpose of preventing leakage of cooling medium, a substantially total periphery of a peripheral edge of the cooling portion may not necessarily be welded, accordingly, the welding operation is facilitated, in carrying out the welding, there is no need of carrying out the welding operation such that a weld portion becomes liquidtight or airtight and therefore, the welding operation is further facilitated. Further, even when a weld defect is accidentally present in a weld portion, there is no leakage of cooling medium from the weld defect portion and accordingly, the atmosphere in the apparatus is not contaminated and accordingly, excellent film forming conditions can be maintained firmly. Further, when the cooling portion is welded to the base portion, both may not be positioned each other strictly and accordingly, there is no need of necessarily using a fixing device for preventing a positional shift therebetween and accordingly, the welding operation is further facilitated. Meanwhile, even when the cooling portion is attached to the base portion by a fastening member, there poses no problem of leakage of cooling medium. Therefore, as attaching means, not only welding but also a fastening member can be used.

Further, it is preferable in the backing plate according to the above-described invention that the base portion is made of aluminum or its alloy.

Thereby, light weight formation of the backing plate can be achieved.

Further, it is preferable in the backing plate according to the above-described invention that the base portion is made of copper or its alloy.

Thereby, thermal conductivity of the base portion of the backing plate can be made high by which cooling function of the backing plate is promoted.

Further, according to the backing plate of the invention, it is preferable that the cooling portion is made of aluminum or its alloy.

Thereby, light weight formation of the backing plate can be achieved.

Further, according to the backing plate of the invention, it is preferable that the cooling portion is made of copper or its alloy.

Thereby, the thermal conductivity of the cooling portion of the backing plate can be made high by which the cooling function of the backing plate is promoted.

Further, according to the backing plate of the invention, it is preferable that the cooling portion is constituted by a roll bond panel.

Thereby, there is no need of using expensive forming dies for forming a cooling medium flow path and accordingly, even when a cooling medium flow path having a complicated circuit mode is formed, the cooling medium flow path can be formed without resulting in an increase in the cost, complicated formation of the circuit mode of the cooling medium flow path can simply be achieved by which the cooling function of the backing plate is promoted.

Further, according to the backing plate of the invention, it is preferable that the cooling portion is constituted by a roll bond panel made of aluminum or its alloy.

Thereby, light weight formation of the backing plate can be achieved, further, complicated formation of the circuit mode of the cooling medium flow path can simply be achieved by which the cooling function of the backing plate is promoted.

Further, according to the backing plate of the invention, it is preferable that the cooling portion is constituted by a roll bond panel made of copper or its alloy.

Thereby, the thermal conductivity of the cooling portion of the backing plate can be made high, complicated formation of the cooling mode of the cooling medium flow path can simply be achieved by which the cooling function of the backing plate is promoted.

Further, according to the backing plate of the invention, it is preferable that the base portion and the cooling portion are made of the same kind of metal and attached together by friction agitation bonding.

Friction agitation bonding is a kind of solid-phase bonding and therefore, there are achieved advantages in which not only metals of the same kind can solidly be bonded but also metals of different kinds can solidly be bonded, further, occurrence of thermal strain or warping in welding operation can be prevented. Therefore, by using the friction agitation bonding as attaching means, occurrence of thermal strain or warping can be prevented and a degree of close contact between a target and the base portion is improved.

Further, according to the backing plate of the invention, it is preferable that the base portion and the cooling portion are made of different kinds of metals, from each other and are attached together by the friction agitation bonding.

Thereby, even when the base portion and the cooling portion are made of different kinds of metals from each other, by using the friction agitation bonding as attaching means, the base portion and the cooling portion can solidly be attached together, occurrence of thermal strain or warping can be prevented and accordingly, the degree of close contact between the target and the base portion is improved.

Further, according to the backing plate of the invention, it is preferable that either of the base portion and the cooling portion is made of aluminum or its alloy and other thereof is made of copper or its alloy and the base portion and the cooling portion are attached together by the friction agitation bonding.

Thereby, light weight formation and high thermal conductivity formation of the backing plate can be achieved. Further, the base portion and the cooling portion can solidly be attached together, occurrence of thermal strain or warping can be prevented and accordingly, the degree of close contact between the target and the base portion is improved.

Further, according to the backing plate of the invention, it is preferable that the base portion is made of copper or its alloy, the cooling portion is constituted by a roll bond panel made of aluminum or its alloy and the base portion and the cooling portion are attached together by the friction agitation bonding.

Thereby, light weight formation and high thermal conductivity formation of the backing plate can be achieved and complicated formation of a circuit mode of the cooling medium flow path can simply be achieved. Further, the base portion and the cooling portion can solidly be attached together, occurrence of thermal strain or warping can be prevented and accordingly, the degree of close contact between the target and the base portion is improved.

Further, according to the backing plate of the invention, it is preferable that the base portion is made of aluminum or its alloy, the cooling portion is constituted by a roll bond panel made of copper or its alloy and the base portion and the cooling portion are attached together by the friction agitation bonding.

Thereby, light weight formation and high thermal conductivity formation of the backing plate can be achieved and complicated formation of a circuit mode of the cooling medium flow path can simply be achieved. Further, the base portion and the cooling portion can solidly be attached together, occurrence of thermal strain or warping can be prevented and accordingly, the degree of close contact between the target and the base portion is improved.

Further, according to the backing plate of the invention, it is preferable that the base portion is made of aluminum or its alloy, the cooling portion is constituted by a roll bond panel made of aluminum or its alloy and the base and the cooling portion are attached together by the friction agitation bonding.

Thereby, light weight formation of the backing plate can be achieved and complicated formation of the circuit mode of the cooling medium flow path can simply be achieved. Further, the base portion and the cooling portion can solidly be attached together, occurrence of thermal strain or warping can be prevented and accordingly, the degree of close contact between the target and the base portion is improved.

Further, according to the backing plate of the invention, it is preferable that the base portion is made of copper or its alloy, the cooling portion is constituted by a roll bond panel made of copper or its alloy and the base portion and the cooling portion are attached together by the friction agitation bonding.

Thereby, high thermal conductivity formation of the backing plate can be achieved and complicated formation of the circuit mode of the cooling medium flow path can simply be achieved. Further, the base portion and the cooling portion can solidly be attached together, occurrence of thermal strain or warping can be prevented and therefore, the degree of close contact between the target and the base portion is improved.

Further, according to the backing plate of the invention, it is preferable that the base portion and the cooling portion are made of the same kind of metal and attached together by welding utilizing a high energy density heat source.

DETAILED DESCRIPTION OF THE PREFERRED EMBODIMENTS

An explanation will be given of preferred embodiments according to the invention in reference to the drawings as follows.

Figure 1A:
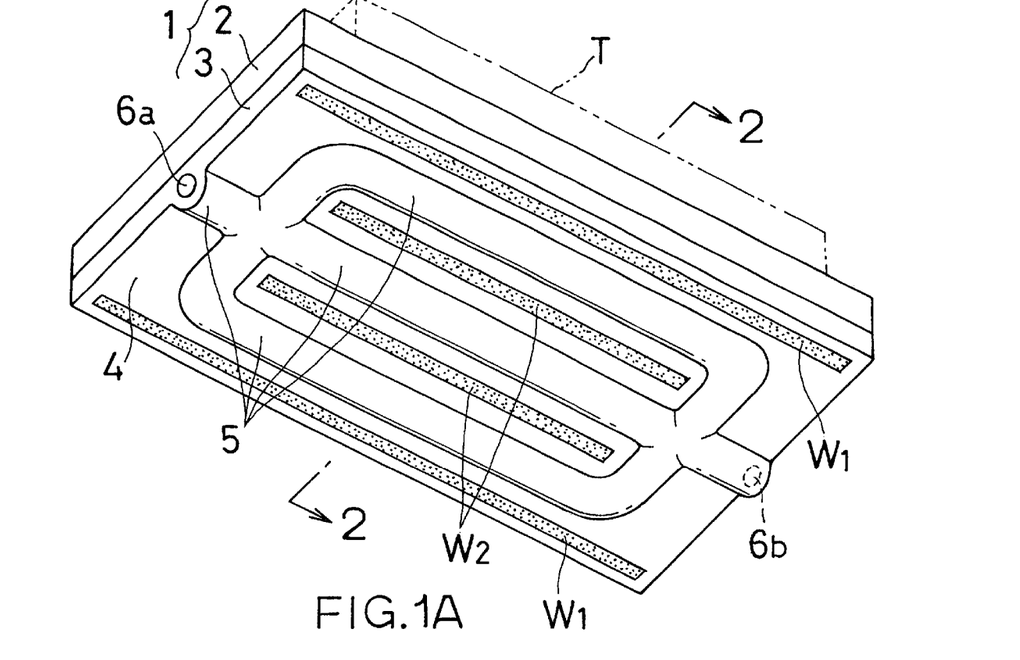
FIG. 1A is a perspective view of a backing plate for sputtering according to an embodiment of the invention.
Figure 1B:
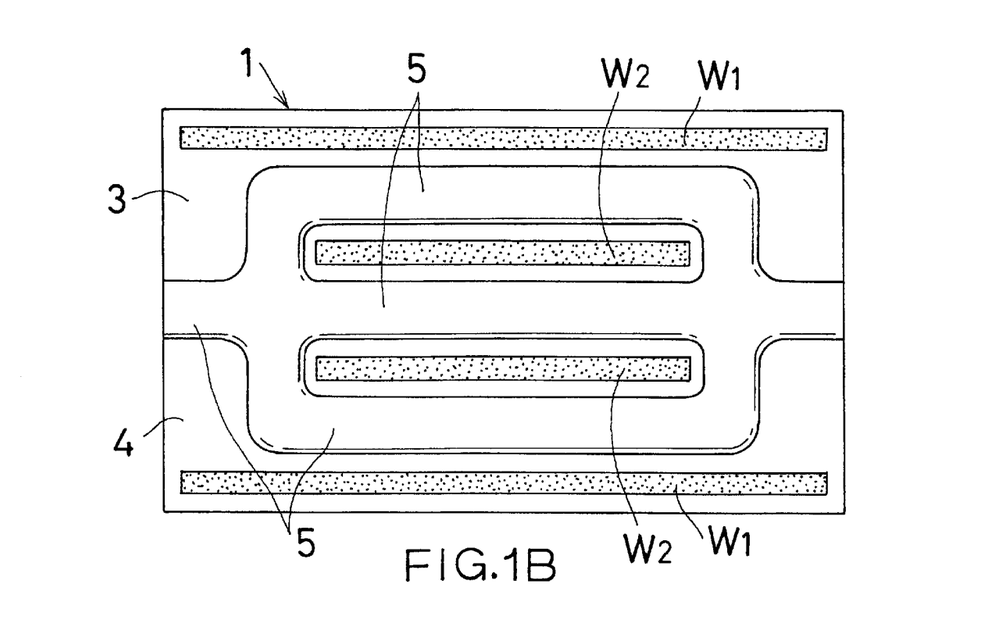
FIG. 1B is a bottom view of the backing plate.
Figure 2:
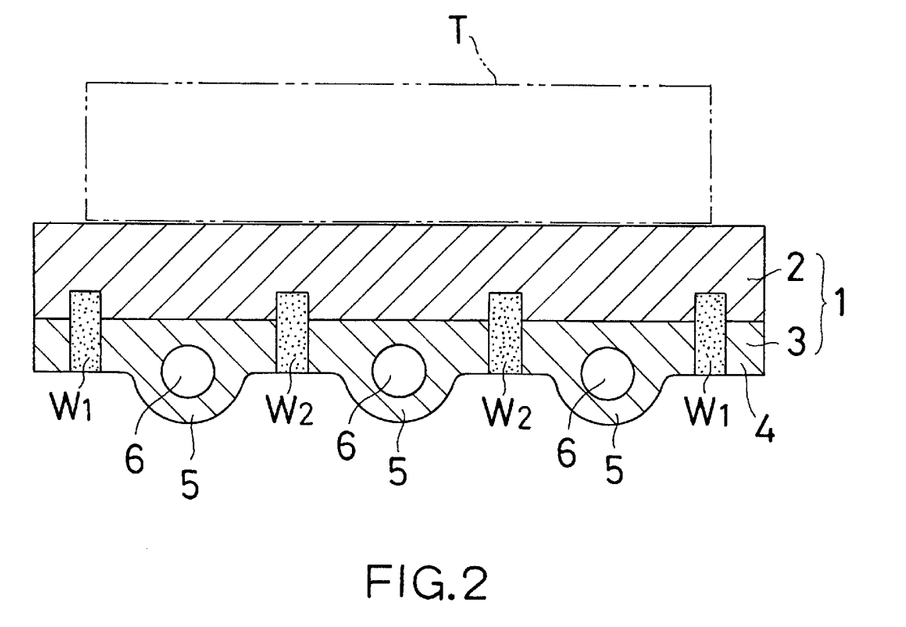
FIG. 2 is a sectional view taken along a line 2—2 of FIG. 1A.

FIG. 1A through FIG. 4 show a backing plate for sputtering according to an embodiment of the invention. In FIG. 1A through FIG. 2, notation 1 designates a backing plate for sputtering according to the embodiment.

The backing plate 1 comprises a base portion 2 in a shape of a square flat plate and a cooling portion 3 in a shape of a square flat plate having the same size with that of the base portion 2. Further, a target T of an ITO sintered body is attached to a surface of the base portion 2 in a face contact state. Meanwhile, the cooling portion 3 is integrally attached to the rear face of the base 2 by welding (weld portions W1, W2).

The base portion 2 comprises a metal plate having a flat surface and a flat rear face and as the metal plate, according to the embodiment, a plate made of aluminum (including its alloy, the same as follows) is used. The base portion 2 is provided with a predetermined thickness such that the base portion 2 is not bent when the base portion 2 is attached with the cooling portion 3 by welding.

The cooling portion 3 is constituted by a roll bond panel 4 made of aluminum and formed with bulged pipe portions 5 in a circuit shape substantially over the entire face thereof.

The roll bond panel 4 constituting the cooling portion 3 is fabricated in accordance with a normal process. A simple explanation will be given of a method of fabricating thereof. A pressure bonding preventive agent is printed on one face of either of two aluminum plates in a predetermined pattern, the other aluminum plate is attached to the former and both are subjected to pressure bonding and integrated to thereby constitute a clad plate. Successively, non pressure-bonded portions are bulged by introducing hydraulic pressure to the non pressure-bonded portions by which the bulged pipe portions 5 in accordance with the printed pattern is formed on the clad face.

The bulged pipe portions 5 of the roll bond panel 4 are bulged only to one face side and inner hollow portions thereof constitute a cooling medium flow path 6. Further, a cooling medium flow inlet 6a comprising an opening portion of one end of the bulged pipe portion 5 is formed at one end face in the length direction of the panel 4. Meanwhile, a cooling medium flow outlet 6b comprising an opening portion of the other end of the bulged pipe portion 5 is similarly formed at an end face thereof on the opposite side. The cooling medium flows from the flow inlet 6a into the cooling medium flow path 6 and flows out to the flow outlet 6b. Further, a flat face on the other side of the roll bond panel 4 is brought into contact with the rear face of the base portion 2 in a face contact state and under the state, both edge portions in the width direction of the panel 4 and portions at a central portion of the panel 4 where the bulged pipe portions 5 are not formed, are fixedly welded to the base portion 2.

The welding is carried out from the rear face side of the cooling portion 3. As the welding means, there is used friction agitation bonding in which a probe in a shape of a rotating pin is inserted into a portion to be welded and while softening a portion in contact with the probe by friction heat and agitating the contact portion, the probe is moved along the portion to be welded in the inserted state by which the welding is carried out.

Figure 3:
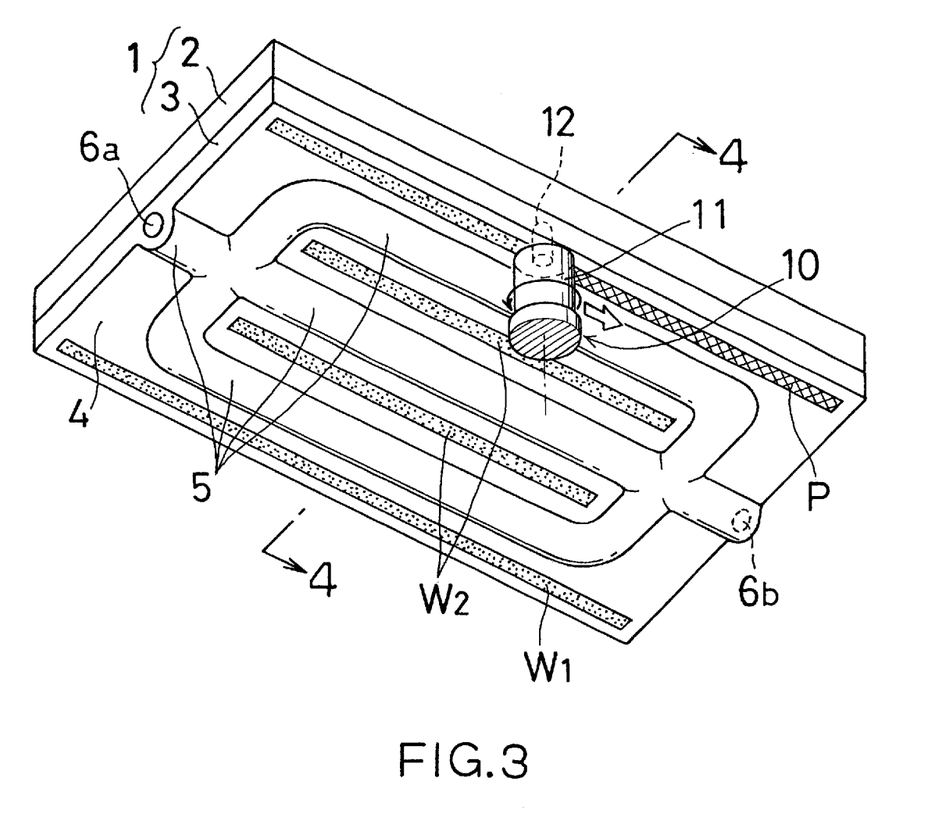
FIG. 3 is a perspective view showing a state in the midst of attaching together a base portion and a cooling portion by friction agitation bonding in the backing plate.
Figure 4:
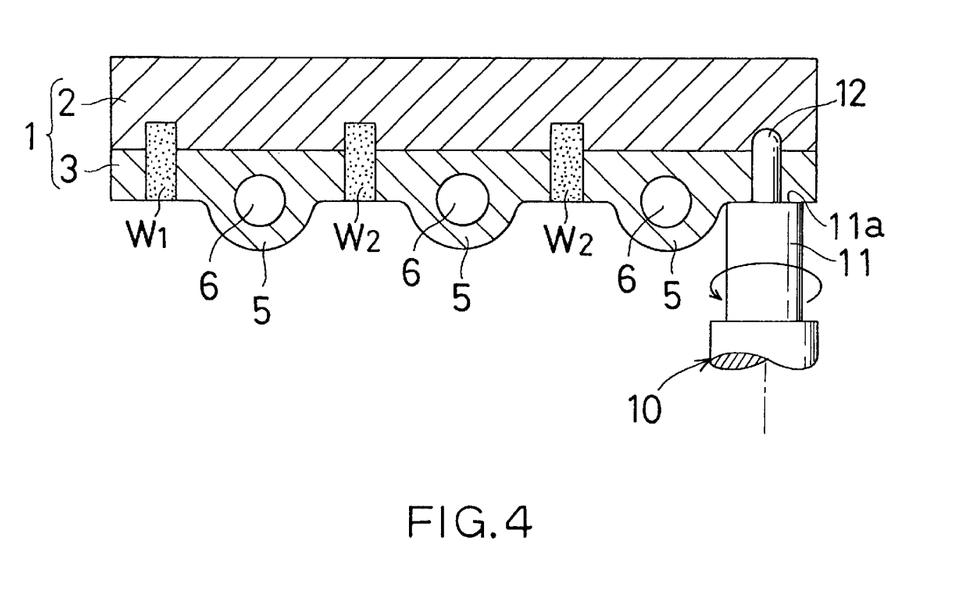
FIG. 4 is a sectional view taken along a line 4—4 of FIG. 3.

An explanation will be given of the friction agitation bonding as follows. In FIG. 3 and FIG. 4, notation 10 designates a bonding tool for friction agitation bonding. The bonding tool 10 is provided with a cylindrical rotor 11 having a large diameter and a pin-like probe 12 having a small diameter projected on the axial line of an end face 11a of the rotor 11. The rotor 11 and the probe 12 are formed by a heat resistant material which is harder than metals constituting the cooling portion 3 and the base portion 2 and capable of withstanding friction heat generated in bonding operation. Further, there are provided projected portions for agitating softened portion, not illustrated, at a peripheral face of the probe 12.

By using the bonding tool 10 and while rotating the probe 12 by rotating the rotor 11, the probe 12 is inserted to a portion to be welded P from the rear face side of the cooling portion 3. As shown in FIG. 4, the inserting operation is carried out until a front end of the probe 12 is inserted into the base portion 2 by passing through the wall thickness of the cooing portion 3. At this occasion, there is brought about a state in which the end face 11a of the rotor 11 is brought into contact with the rear face of the cooling portion 3. Further, the probe 12 is moved relatively in the inserted state along the portion to be welded P.

By friction heat produced by rotating the probe 12 or friction heat produced in accordance with an abrasive movement between the end face 11a of the rotor 11 and the rear face of the cooling portion 3, the portion in contact with the probe 12 and its vicinity are softened, the softened portion is agitated by rotating the probe 12, in accordance with the movement of the probe 12, the softened and agitated portion is plastically flowed in a mode in which the softened and agitated portion undergoes a progressive pressure of the probe 12 and flows round about to the rear side of the probe 12 in the progressing direction, thereafter, rapidly loses the friction heat and is cooled and solidified. The phenomenon is successively repeated in accordance with the relative movement of the probe 12 and finally, the cooling portion 3 is integrally bonded to the rear face of the base 2 at portions thereof where the probe 12 has passed through.

The friction agitation bonding is a kind of solid-phase bonding and accordingly, there are provided advantages in which metals of different kinds can be bonded together, occurrence of thermal strain or warping in welding operation can be restrained and so on.

In this way, the base portion 2 and the cooling portion 3 are integrally bonded by the friction agitation bonding to thereby provide the backing plate 1 shown in FIG. 1A through FIG. 2.

According to the backing plate 1, the base portion 2 and the cooling portion 3 are attached together by the friction agitation bonding and accordingly, no gap caused by thermal strain or warping is produced therebetween and the base portion 2 and the cooling portion 3 are attached together in a face contact state. Therefore, the obtained backing plate 1 is provided with high cooling function.

Further, in welding the cooling portion 3 and the base portion 2, there is no need of accurately positioning them and therefore the use of, a fixing device as positional shift preventing means is not necessary and accordingly, the welding operation can simply be carried out. Further, the welding may be carried out to a degree at which the face contact state between the cooling portion 3 and the base portion 2 can be maintained and accordingly, welding at several portions thereof is sufficient and therefore, a time period required for the welding is shortened and the efficiency of the welding operation is significantly promoted.

The backing plate 1 can be used in a similar way to the conventional backing plate. That is, in a short explanation, the backing plate 1 is arranged at a predetermined position of sputtering apparatus and the target T is attached onto the surface of the base portion 2. Further, the film forming operation is carried out while flowing cooling medium in the cooling medium flow path 6 comprising the hollow portions of the bulged pipe portions 5 of the cooling portion 3. Even when a weld defect of nonwelded portion or the like is supposedly present at the weld portion W1, W2, there is no concern of leakage of the cooling medium to outside and therefore, the atmosphere in the film forming operation is not contaminated and therefore, a sputtered film of excellent quality can firmly be formed. Further, there is produced almost no thermal strain or warping accompanied by welding in the backing plate 1 and accordingly, there is achieved an advantage in which the target T can be attached onto the base portion 2 in the face contact state and the target T can swiftly be cooled.

Further, both of the base portion 2 and the cooling portion 3 constituting the backing plate 1 are made of aluminum and therefore, the backing plate 1 becomes considerably lightweighted. Particularly, in recent years, with large size formation of the backing plate 1, light weight formation thereof is needed and by fabricating both of the base portion 2 and the cooling portion 3 by aluminum as in the embodiment, the required light weight formation of the backing plate 1 can be achieved.

Further, the cooling portion 3 is constituted by the roll bond panel 4 and therefore, the circuit mode of the cooling medium flow path 6 formed at an inner portion thereof can be made further complicated other than the mode shown by the embodiment and such a complicated circuit can simply be formed. Because it is sufficient to print a pressure bonding preventive agent such that the bulged pipe portions 5 constitute a complicated circuit. Therefore, by constituting the cooling portion 3 by the roll bond panel 4 as in the embodiment, the cooling portion 3 an inner portion of which is provided with the cooling medium flow path 6 constituting a complicated circuit can simply be fabricated and accordingly, the backing plate 1 having excellent cooling function can simply be fabricated. As a result, the fabrication cost of the backing plate 1 can considerably be reduced.

Further, the backing plate according to the invention is not limited to the above-described embodiment and can be modified variously.

Figure 5A:
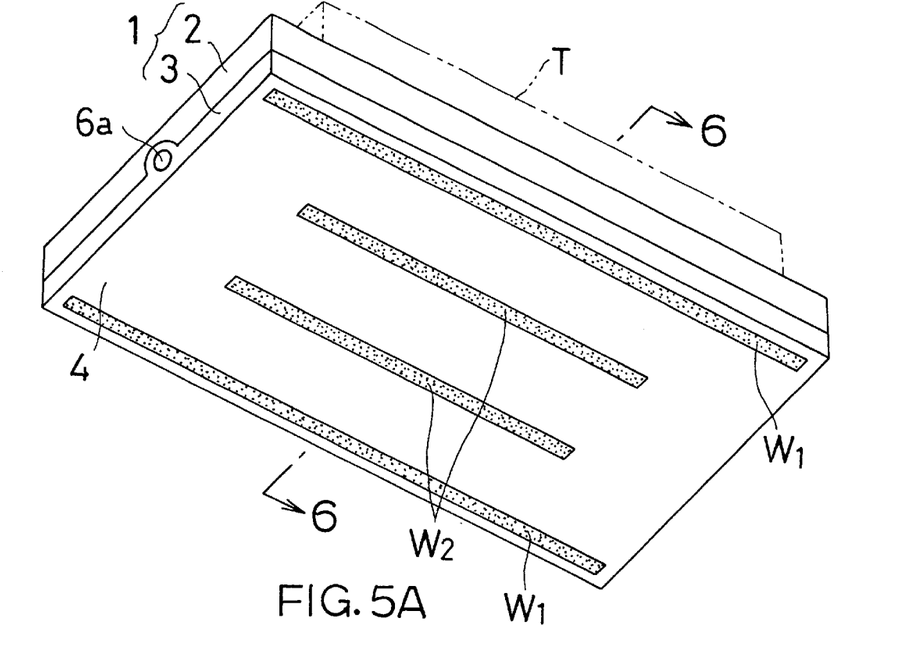
FIG. 5A is a perspective view showing a backing plate for sputtering according to another embodiment of the invention.
Figure 5B:
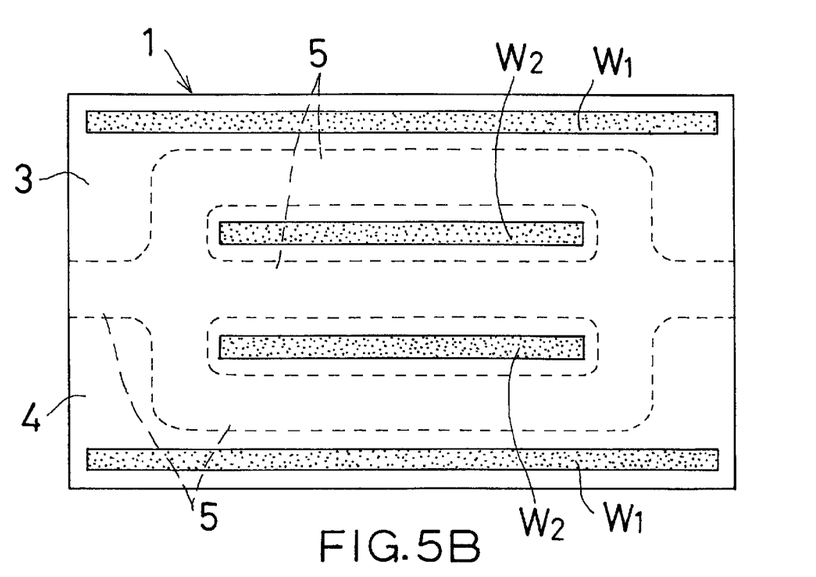
FIG. 5B is a bottom view of the backing plate.
Figure 6:
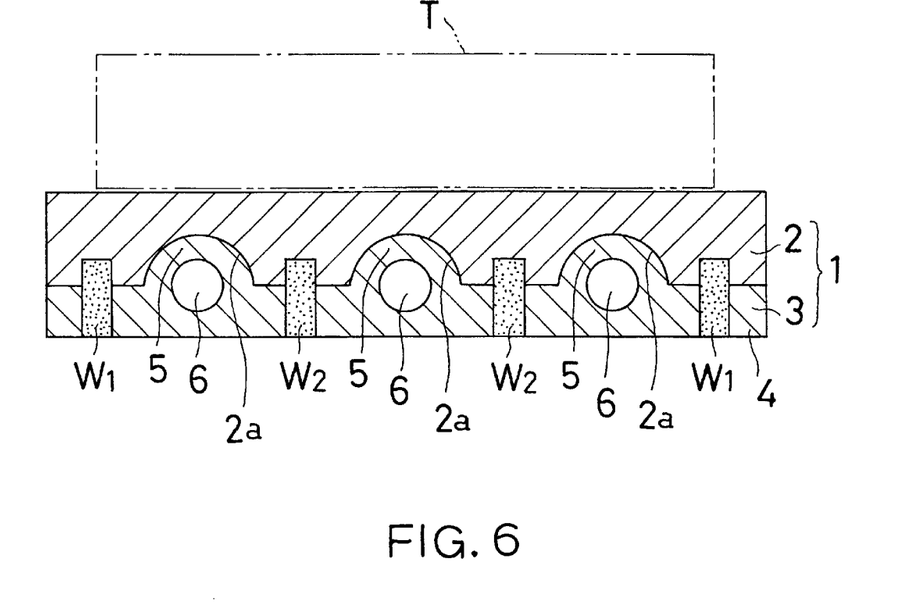
FIG. 6 is a sectional view taken along a line 6—6 of FIG. 5A.

For example, a backing plate according to the invention may be as shown in FIG. 5A through FIG. 6. Further, in the drawings, the same notations are attached to the elements same as those in the backing plate of the above-described embodiment. A simple explanation will be given of the constitution of the backing plate 1 shown in the drawings as follows.

That is, as shown in FIG. 6, a rear face of the base portion 2 of the backing plate 1 is installed with grooves 2a in correspondence with the bulged pipe portions 5 of the roll bond panel 4 constituting the cooling portion 3. Further, the roll bond panel 4 is integrally attached with the rear face of the base portion 2 by welding (weld portions W1, W2) in a face contact state in which the bulged pipe portions 5 of the roll bond panel 4 are perfectly fitted into the grooves 2a. The welding is carried out by the above-described friction agitation bonding.

Further, the invention is not limited to these two embodiments. For example, the roll bond panel 4 constituting the cooling portion 3 may be made of copper (including its alloy, the same as follows). In this way, by constituting the cooling portion 3 by the roll bond panel made of copper, the thermal conductivity at the cooling portion 3 of the backing plate 1 is increased and accordingly, the cooling function of the backing plate 1 is further promoted.

Further, in the case in which the base portion made of aluminum and the cooling portion made of copper are attached together by welding, it is preferable to use the above-described friction agitation bonding as attaching means in view of the fact that the cooling portion and the base portion can integrally be bonded solidly and occurrence of thermal strain or warping can be prevented. By similar reasons, also in the case in which the base portion made of copper and the cooling portion made of aluminum are attached together by welding, it is preferable to use the above-described friction agitation bonding as attaching means.

Further, when the base portion and the cooling portion are made of the same kind of metal, as attaching means, in place of the above-described friction agitation bonding, there can be adopted welding utilizing a high energy density heat source such as laser welding or electron beam welding. According to the welding utilizing the high energy density heat source, there is an advantage that welding at high speed is possible.

Further, the cooling portion 3 is not necessarily constituted by a roll bond panel but may be fixedly attached with metal pipes for a cooling medium flow path by welding at one face of a metal plate. In this case, it is preferable to provide grooves in correspondence with the outer diameter of the metal pipe at one face of the metal plate and fitting the metal pipes into the grooves along therewith to thereby embed the metal pipes into the metal plate. Further, it is preferable to bend the metal pipes in a meandering shape to provide uniform cooling.

As has been described, according to the backing plate for sputtering of the invention, the cooling portion made of metal in a plate-like shape having the cooling medium flow path at an inner portion thereof is attached to the base portion made of metal in a plate-like shape and therefore, in fabricating the backing plate, the following effects are achieved.

That is, when the cooling portion is attached to the base portion by welding with a purpose of preventing leakage of cooling medium, substantially a total periphery of a peripheral edge of the cooling portion may not necessarily be welded and therefore, the welding operation is facilitated, further, it is not necessary to weld the weld portion to be liquidtight or airtight and accordingly, the welding operation is further facilitated. Further, the base portion and the cooling portion need not to position each other strictly and accordingly, there is no need of necessarily using a fixing device for preventing a positional shift therebetween and accordingly, the welding operation is further facilitated. Further, even when the cooling portion is attached to the base portion by a fastening member, there poses no problem of leakage of cooling medium. Therefore, according to the invention, there is achieved an effect that the backing plate can be fabricated simply without resulting in an increase in the cost. Further, according to the backing plate of the invention, even when a weld defect is supposedly present at a weld portion, there is no leakage of cooling medium from the weld defect portion and therefore, atmosphere in the apparatus is not contaminated. Accordingly, the invention is advantageous in maintaining excellent film forming conditions without fail.

Further, when the base portion is made of aluminum or its alloy, a light-weighted backing plate can be provided.

Further, when the base portion is made of copper or its alloy, the thermal conductivity of the base portion of the backing plate becomes high and accordingly, a backing plate having excellent cooling function can be provided.

Further, when the cooling portion is made of aluminum or its alloy, a light-weighted backing plate can be provided.

Further, when the cooling portion is made of copper or its alloy, the thermal conductivity of the cooling portion of the backing plate becomes high and therefore, a backing plate having excellent cooling function can be provided.

Further, when the cooling portion is constituted by a roll bond panel, there is no need of using expensive forming dies for forming a cooling medium flow path and accordingly, even when a cooling medium flow path having a complicated circuit mode is formed, the cooling medium flow path can be formed without resulting in an increase of the cost, complicated formation of a circuit mode of a cooling medium flow path can simply be achieved and accordingly, a backing plate having excellent cooling function can be provided.

Further, when the cooling portion is constituted by a roll bond panel made of aluminum or its alloy, a backing plate which is light-weighted and has excellent cooling function can be provided.

Further, when the cooling portion is constituted by a roll bond panel made of copper or its alloy, a backing plate having extremely high cooling function can be provided.

Further, when the base portion and the cooling portion are made of the same kind of metal and are attached together by friction agitation bonding, almost no thermal strain or warping is caused and accordingly, a backing plate capable of being attached with a target in close contact therewith can be provided.

Further, when the base portion and the cooling portion are made of different kinds of metals from each other and are attached together by friction agitation bonding, almost no thermal strain or warping is caused and accordingly, a backing plate capable of being attached with a target in close contact therewith can be provided.

Further, when the base portion is made of copper or its alloy, the cooling portion is constituted by a roll bond panel made of aluminum or its alloy and the base portion and the cooling portion attached together by friction agitation bonding, a backing plate which is light-weighted and has excellent cooling function can be provided, further, almost no thermal strain or warping is caused and therefore, the backing plate capable of being attached with a target in close contact therewith can be provided.

Further, when the base portion is made of aluminum or its alloy, the cooling portion is constituted by a roll bond panel made of copper or its alloy and the base portion and the cooling portion are attached together by friction agitation bonding, a backing plate which is light-weighted and has excellent cooling function can be provided, further, almost no thermal strain or warping is caused and therefore, the backing plate capable of being attached with a target in close contact therewith can be provided.

Further, when the base portion is made of aluminum or its alloy, the cooling portion is constituted by a roll bond panel made of aluminum or its alloy and the base portion and the cooling portion are attached together by friction agitation bonding, a backing plate which is extremely light-weighted and has excellent cooling function can be provided, further, almost no thermal strain or warping is caused and accordingly, a backing plate capable of being attached with a target in close contact therewith can be provided.

Further, when the base portion is made of copper or its alloy, the cooling portion is constituted by a roll bond panel made of copper or its alloy and the base portion and the cooling portion are attached together by friction agitation bonding, a backing plate having extremely high cooling function can be provided, further, almost no thermal strain or warping is caused and accordingly, a backing plate capable of being attached with a target in close contact therewith can be provided.

The application is accompanied by a priority of Japanese Patent Application No. 10-242821 filed on Aug. 28, 1998 and the content of the disclosure constitutes a portion of the present application as it is.

Technical terms and explanation used here are used for explaining the embodiments according to the invention and the invention is not limited thereto. Within the range of the invention specified in claims, any design change is permitted so far as the design change does not deviate from the spirit of the invention.

What is claimed is:

1. A backing plate for sputtering, comprising:
    a metal base portion; and
    a metal cooling portion having a cooling medium flow path at an inner portion thereof, the cooling portion being attached to the base portion, wherein the cooling portion is constituted by a roll bond panel, wherein said roll bond panel is comprised of two plates compressively bonded except for non-bonded portions, an inside of said non-bonded portion being expanded to form said cooling medium flow path, whereby cooling medium passing through said cooling medium flow path is prevented from coming in contact with said base portion by one of said two plates disposed between said cooling medium flow path and said base portion, wherein the base portion and the cooling portion are attached together by friction agitation bonding, and wherein the friction agitation bonding is conducted by inserting a rotating pin-shaped probe into a portion to be joined and relatively moving the inserted rotating probe along the portion while softening and agitating the portion in contact with the probe by friction heat.

2. The backing plate for sputtering according to claim 1, wherein the base portion and the cooling portion are made of the same kind of metal.

3. The backing plate for sputtering according to claim 1, wherein the base portion and the cooling portion are made of respectively different kinds of metals.

4. The backing plate for sputtering according to claim 1, wherein either of the base portion or the cooling portion is made of aluminum or an alloy thereof, and the other portion thereof is made of copper or an alloy thereof.

5. The backing plate for sputtering according to claim 1, wherein the base portion is made of copper or an alloy thereof, and the cooling portion is constituted by a roll bond panel made of aluminum or an alloy thereof.

6. The backing plate for sputtering according to claim 1, wherein the base portion is made of aluminum or an alloy thereof, and the cooling portion is constituted by a roll bond panel made of copper or an alloy thereof.

7. The backing plat for sputtering according to claim 1, wherein the base portion is made of aluminum or an alloy thereof, and the cooling portion is constituted by a roll bond panel made of aluminum or an alloy thereof.

8. The backing plate for sputtering according to claim 1, wherein the base portion is made of copper or an alloy thereof, and the cooling portion is constituted by a roll bond panel made of copper or an alloy thereof.

\* \* \* \* \*